US008674255B1

(12) United States Patent
Lenz et al.

(10) Patent No.: US 8,674,255 B1
(45) Date of Patent: *Mar. 18, 2014

(54) APPARATUS AND METHOD FOR CONTROLLING ETCH UNIFORMITY

(75) Inventors: Eric Lenz, Pleasanton, CA (US); Raj Dhindsa, San Jose, CA (US); Dave Trussell, Fremont, CA (US); Lumin Li, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 913 days.

This patent is subject to a terminal disclaimer.

(21) Appl. No.: 11/298,804

(22) Filed: Dec. 8, 2005

(51) Int. Cl.
*H01J 7/24* (2006.01)
*B23K 9/00* (2006.01)

(52) U.S. Cl.
USPC ............. 219/121.43; 315/111.21; 315/111.81

(58) Field of Classification Search
USPC ................... 219/121.43, 121.41; 204/298.38, 204/298.39, 298.32, 289.32; 156/345.36, 156/345.44, 345.47, 345.48, 345.41; 315/111.21; 438/7, 9, 10; 118/723.1, 118/723 MW; 216/67, 69
See application file for complete search history.

(56) References Cited

U.S. PATENT DOCUMENTS

| | | | | |
|---|---|---|---|---|
| 6,259,334 B1 * | 7/2001 | Howald | ....................... | 333/17.3 |
| 2003/0148611 A1 * | 8/2003 | Dhindsa et al. | ............... | 438/689 |
| 2003/0201069 A1 * | 10/2003 | Johnson | .................... | 156/345.43 |
| 2004/0112536 A1 * | 6/2004 | Quon | ....................... | 156/345.28 |
| 2004/0222189 A1 * | 11/2004 | Fischer | ........................... | 216/67 |
| 2005/0039682 A1 * | 2/2005 | Dhindsa et al. | ............ | 118/723 E |
| 2005/0133163 A1 * | 6/2005 | Shannon et al. | .......... | 156/345.44 |
| 2006/0118518 A1 * | 6/2006 | Rusu et al. | ....................... | 216/67 |

* cited by examiner

*Primary Examiner* — Brian Jennison
(74) *Attorney, Agent, or Firm* — Martine Penilla Group, LLP.

(57) ABSTRACT

A plasma processing system is provided. The plasma processing system includes a radio frequency (RF) power generator configured to have a tunable frequency power output, the frequency output being adjustable within a range. A processing chamber having a bottom electrode and a top electrode is included. A plasma region being defined between the bottom and top electrodes and the processing chamber receives RF power from the RF power generator. A match network is coupled between the RF power generator and the processing chamber. The match network has a first tunable element and a second tunable element. The first tunable element adjusts a split between a first grounding pathway defined within an inner region of the plasma region and a second grounding pathway defined within an outer region of the plasma region. The second tunable element adjusts a load delivered to the processing chamber from the power generator.

18 Claims, 6 Drawing Sheets

APPARATUS AND METHOD FOR CONTROLLING ETCH UNIFORMITY

BACKGROUND OF THE INVENTION

Semiconductor processing systems are generally used to process semiconductor wafers for fabrication of integrated circuits. For example, plasma enhanced semiconductor processes are commonly used in etching, oxidation, chemical vapor deposition, or the like. The plasma-enhanced semiconductor processes are typically carried out by means of plasma processing systems.

The uniformity of etching operations performed in the plasma processing systems is constantly being reviewed for etch uniformity improvement. As feature sizes continue to shrink, the etch uniformity becomes more critical. The matching network for current etch systems typically tune the match network to a point where the power reflectance is at a minimum. Matching networks typically include tunable elements that adjust how the load looks for the generator and a tunable element to adjust the phase angle. Thus, the generator is typically programmed to control the phase to minimize reflected power. However, neither one of the tunable elements address varying the etch uniformity. For example, as an etch operation progresses process variables, such as temperature, may change, which in turn causes a change in impedance. This change in impedance may result in a change in the etch uniformity which is not addressed by solely focusing on keeping the power reflectance to a minimum.

In view of the foregoing, there is a need for an apparatus and device, which provides a further flexibility for controlling the etch uniformity achieved within the plasma processing chamber.

SUMMARY OF THE INVENTION

Broadly speaking, the present invention fills these needs by providing an apparatus and method for enhancing the etch uniformity achieved in a plasma processing chamber. It should be appreciated that the present invention can be implemented in numerous ways, including as an apparatus, a system, a device, or a method. Several inventive embodiments of the present invention are described below.

In one embodiment, a plasma processing system is provided. The plasma processing system includes a radio frequency (RF) power generator configured to have a tunable frequency power output, the frequency output being adjustable within a range. A processing chamber having a bottom electrode and a top electrode is included. A plasma region being defined between the bottom and top electrodes and the processing chamber receives RF power from the RF power generator. A match network is coupled between the RF power generator and the processing chamber. The match network has a first tunable element and a second tunable element. The first tunable element adjusts a split between a first grounding pathway defined through an inner region of the plasma region and a second grounding pathway defined through an outer region of the plasma region. The second tunable element adjusts a load delivered to the processing chamber from the power generator.

In another embodiment, a system for processing a semiconductor wafer is provided. The system includes a radio frequency (RF) power generator having a tunable frequency output, the tunable frequency output being defined within a range. A processing chamber having a bottom electrode and a top electrode is included. A plasma region is defined between the bottom and top electrodes, the processing chamber receives RF power from the RF power generator. A match network is coupled between the RF power generator and the processing chamber. The match network includes a feedback controller monitoring a bias voltage associated with the bottom electrode. The feedback controller is configured to adjust an amount of power radially distributed over a surface of the substrate being process within the processing chamber.

In yet another embodiment, a method of processing a semiconductor substrate within a plasma chamber is provided. The method initiates with delivering radio frequency (RF) power to the processing chamber at a first frequency value. The method includes striking a plasma within a processing chamber and monitoring a bias voltage of the semiconductor substrate on the lower electrode of the processing chamber. The first frequency value is adjusted to a second frequency value to obtain a desired bias voltage value. In one embodiment, the plasma density may be monitored to provide feedback for adjusting the frequency of the RF power.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for a method and apparatus, which maintains a bias voltage to ensure uniformity of an etch operation. In one embodiment, adjustments to the bias voltage are achieved through manipulation of the frequency of the radio frequency (RF) power source. It will be obvious, however, to one skilled in the art, that the present invention may be practiced without some or all of these specific details. In other instances, well known process operations have not been described in detail in order not to obscure the present invention.

The embodiments of the present invention provide an apparatus and method for achieving etch uniformity through bias control. Through the embodiments described herein, additional tuning elements are provided so as to enhance etch uniformity control. In one embodiment, the frequency of the RF power supply is tunable, i.e., may be varied, to adjust the etch uniformity. By varying the frequency of the RF power supply, the power delivered radially over the work piece, e.g., substrate, being etched may be further controlled. Thus, as explained below, the frequency adjustment impacts the current returned through an inner and an outer loop defined within the chamber and through the plasma region enabling further control over the etch uniformity. In one embodiment, the bias voltage is monitored to provide feedback to the generator or a variable capacitance element, to adjust the frequency of the power being delivered to the chamber. In another embodiment, the plasma density is monitored to provide feedback to adjust the frequency of the power delivered to the processing chamber.

Figure 1:
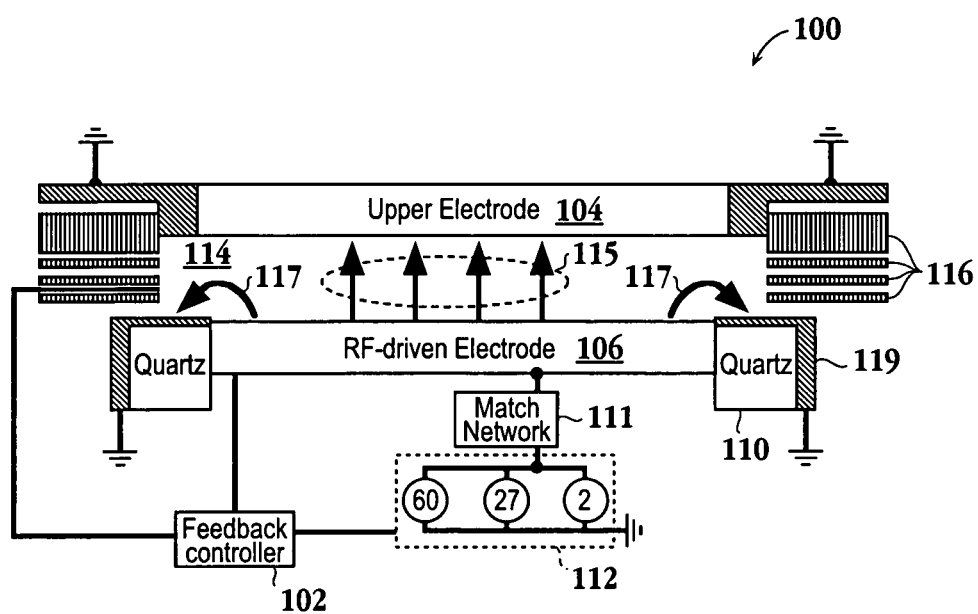
FIG. 1 is a simplified cross-sectional diagram of a capacitively coupled plasma processing chamber capable of varying an etch uniformity in accordance with one embodiment of the invention.

FIG. 1 is a simplified cross-sectional diagram of a capacitively coupled plasma processing chamber capable of varying an etch uniformity in accordance with one embodiment of the invention. Plasma processing chamber 100 includes upper electrode 104 disposed over lower electrode 106. It should be appreciated that a work piece, such as a wafer, may be positioned on lower electrode 106 during etching. A grounded shield 119 surrounds focus ring 110, which surrounds lower electrode 106. During processing, plasma is generated in region 114, above a substrate being processed. Confinement rings 116 confine the etching plasma within region 114 to improve process control and ensure repeatability. Power supply 112 provides an RF current to the lower electrode 106 through match network 111. Exemplary matching networks are provided in commonly assigned U.S. Pat. Nos. 5,793,162 and 6,259,334. Each of these references is incorporated by reference in their entirety for all purposes. While these references work well to adjust the tuning points, there are additional improvements that may be added in order to further enhance the etch uniformity achieved within the processing chamber.

Still referring to FIG. 1, during processing, the current travels towards the upper electrode 104 through region 114. As illustrated, an inner path and an outer path are defined within region 114. The inner path is defined between electrodes 106 and 104 to ground and defines a first grounding pathway. The inner path may be defined through an inner region, as illustrated by the arrows within region 115. In one embodiment, the inner region corresponds to an area defined above an inner circular region of a substrate being processed. Similarly, the outer path shown by arrows 117 is defined within an outer region, which surrounds inner region 115, i.e., the outer region is concentrically located around inner region 115. The outer region defines a second grounding pathway through grounding shield 119. Thus, the outer path and outer region may be associated with an edge region of a substrate being processed. Power supply 112 includes the capability to supply tunable frequencies to chamber 100. As illustrated, power supply 112 includes RF generators capable of generating RF at 60 MHz, 27 MHz and 2 MHz. In one embodiment, the frequency of each RF generator within power supply 112 is tunable to +/−5% of the nominal operating frequency. Thus, the frequency of the 60 megahertz (MHz) RF generator is tunable within a range of 57-63 MHz, and so on for the remaining power supplies. Feedback controller 102 provides the capability to adjust the frequency within the specified range based on feedback of the plasma processing conditions within chamber 100. In one embodiment, feedback controller 102 is a general-purpose computer. However, feedback controller may alternatively be a programmable logic device.

Exemplary plasma processing conditions providing feedback for determining when/how to adjust the frequency output of the power supply include the plasma density and the bias voltage experienced by a substrate on electrode 106. It should be appreciated that upper electrode 104 may also be in communication with a power supply dedicated to the upper electrode.

Figure 2:
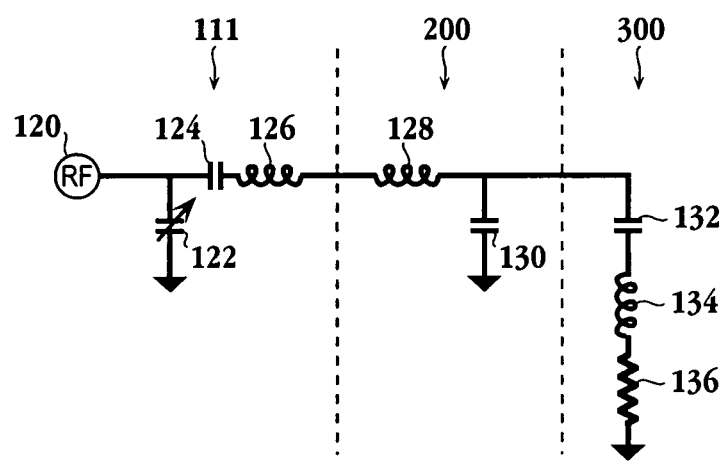
FIG. 2 is a simplified schematic illustrating components within a plasma processing chamber.

FIG. 2 is a simplified schematic illustrating components within a plasma processing chamber. Power supply 120 is configured to supply power at 60 MHz or any other suitable power frequency. Capacitive element 122 is tunable to achieve desired process settings. Capacitive element 124 is also included and inductance element 126 is downstream from capacitive element 124, both being located illustrated within region 111, which represents the match network. Tunable capacitive element 122, capacitive element 124 and inductance element 126 are included in the match network. Region 200, which represents the plasma processing chamber, includes inductance element 128 and capacitive element 130. Region 300 illustrates the plasma processing region, which includes capacitive element 132, inductive element 134, and resistance element 136. As illustrated in FIG. 2, the phase may be controlled by RF power supply 120, while the load is controlled through tunable capacitive element 122. In one embodiment, the load is a 50-ohm load. While this configuration works well to minimize reflected power, there is no mechanism for further controlling the etch rate or the power radially distributed across a substrate undergoing processing in the etch chamber as provided in the embodiments described below.

Figure 3A:
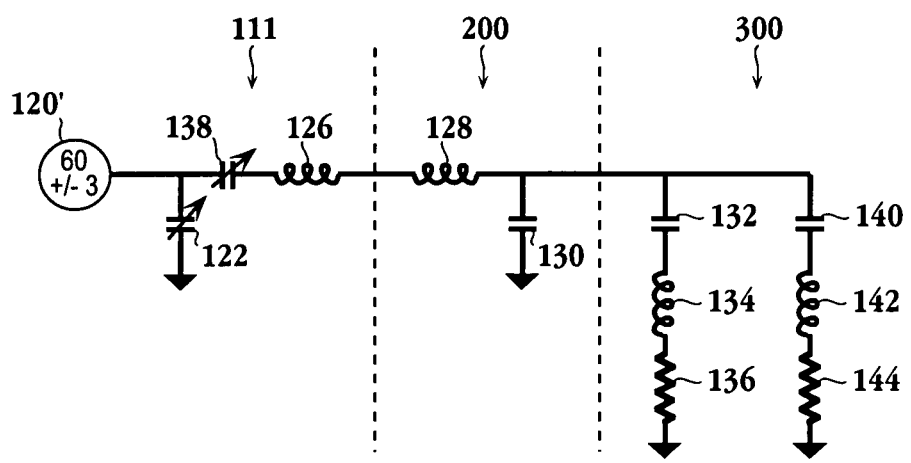
FIG. 3A illustrates an alternative embodiment to the schematic representation in FIG. 2, allowing for enhanced control of the inner and outer paths to impact etch uniformity in accordance with one embodiment of the invention.

FIG. 3A illustrates an alternative embodiment to the schematic representation in FIG. 2, allowing for enhanced control of the inner and outer paths to impact etch uniformity in accordance with one embodiment of the invention. The schematic in FIG. 3 includes tunable RF power supply 120' and tunable capacitive elements 122 and 138. Inductance element 126 is included downstream from capacitive element 138 within region 111, which represents the match network. Inductive element 128 and capacitive element 130 are also provided within the chamber region 200. Within region 300, which represents the plasma processing region within the chamber, two different pathways are represented. The inner pathway is represented by capacitive element 132, inductive element 134, and resistance element 136. The outer pathway is illustrated through capacitive element 140, inductive element 142, and resistance element 144. Tunable RF power supply 120' is illustrated as a 60 MHz power supply capable of varying the frequency within +/−5% of the nominal operating frequency.

Figure 3B:
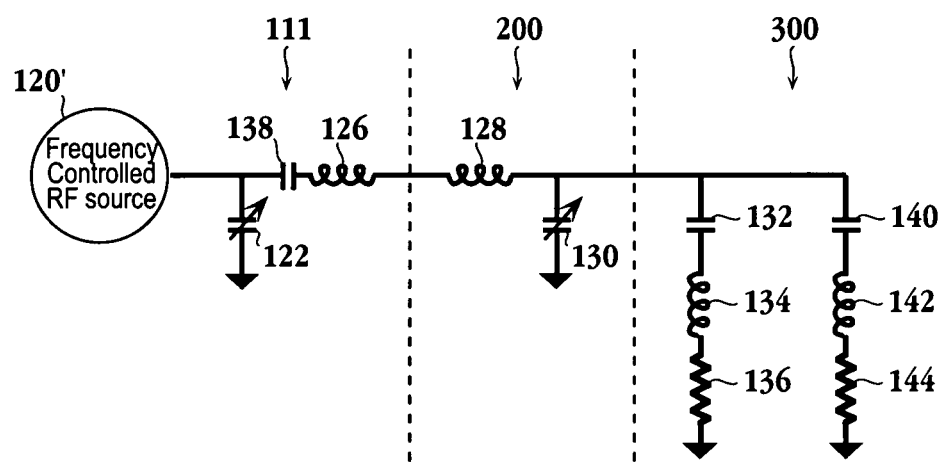
FIG. 3B is an alternative embodiment for enhanced control of the inner and outer paths to impact etch uniformity illustrated in FIG. 3A.

FIG. 3B is an alternative embodiment for enhanced control of the inner and outer paths to impact etch uniformity illustrated in FIG. 3A. FIG. 3B illustrates capacitive element 130 as a tunable capacitive element and capacitive element 138 as a non-tunable element. Thus, the three tunable elements in FIG. 3B include tunable RF power supply 120', tunable capacitive element 122, and tunable capacitive element 130. It should be appreciated that the frequency of RF supply 120' may be used to tune the generator to the lowest reflected power, while tunable capacitive element 130, or 138 of FIG. 3A, may be used to tune the bias to control the inner and outer split of the power within the processing chamber. The plasma within the chamber may change its ratio of grounding between the upper and the outer lower electrodes with small changes in frequency. As the path lengths are different for each of these returns (see FIG. 1), the frequency change may change the preference in the path. As discussed herein, the DC bias value on the wafer being etched or the plasma DC potential may be used to determine this ratio of grounding and provide feedback for control of this ratio. Other feedback mechanisms are available to detect changes in the ratio of grounding, such as probes located at the upper or lower electrodes of FIG. 1. In one embodiment, as the charge of the tunable capacitive element controlling the inner and outer splits becomes larger, the more power is being directed through the outer pathway. One skilled in the art will appreciate that a tunable capacitive element is a variable capacitor or switches that are connected to capacitors that can be switched in or out.

Figure 4:
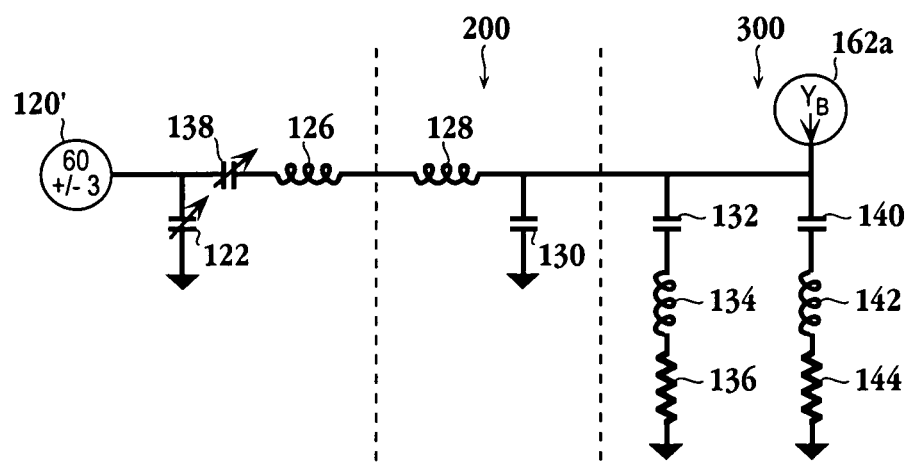
FIG. 4 is a simplified schematic diagram illustrating the elements of FIGS. 3A and 3B with a feedback loop incorporated in order to tune a frequency being supplied to the plasma processing chamber in accordance with one embodiment of the invention.

FIG. 4 is a simplified schematic diagram illustrating the elements of FIGS. 3A and 3B with a feedback loop incorporated in order to tune a frequency being supplied to the plasma processing chamber in accordance with one embodiment of the invention. RF power is supplied through power supply 120' and elements 122, 138, 126, 128, and 130 are similar to the elements discussed above with reference to FIGS. 3A and 3B. Inner and outer loops referenced in FIGS. 1, 3A, and 3B are represented through elements 132 (capacitive), 134 (inductance), and 136 (resistance), and elements 140(capacitive), 142(inductance), and 144(resistance), respectively. Feedback to tune the frequency being supplied to the RF generator is provided by measuring the bias voltage in accordance with one embodiment of the invention. The bias voltage may be measured within the chamber through the lower electrode. It should be appreciated that the bias voltage represents the bias voltage experienced by the wafer being processed. Alternatively, the bias voltage may be measured at the location represented by location 162a between the inner and outer path representations. As mentioned above, the plasma density may be measured as an alternative to the wafer bias. Of course, the plasma density may be measured in multiple locations associated with the plasma region.

Figure 5:
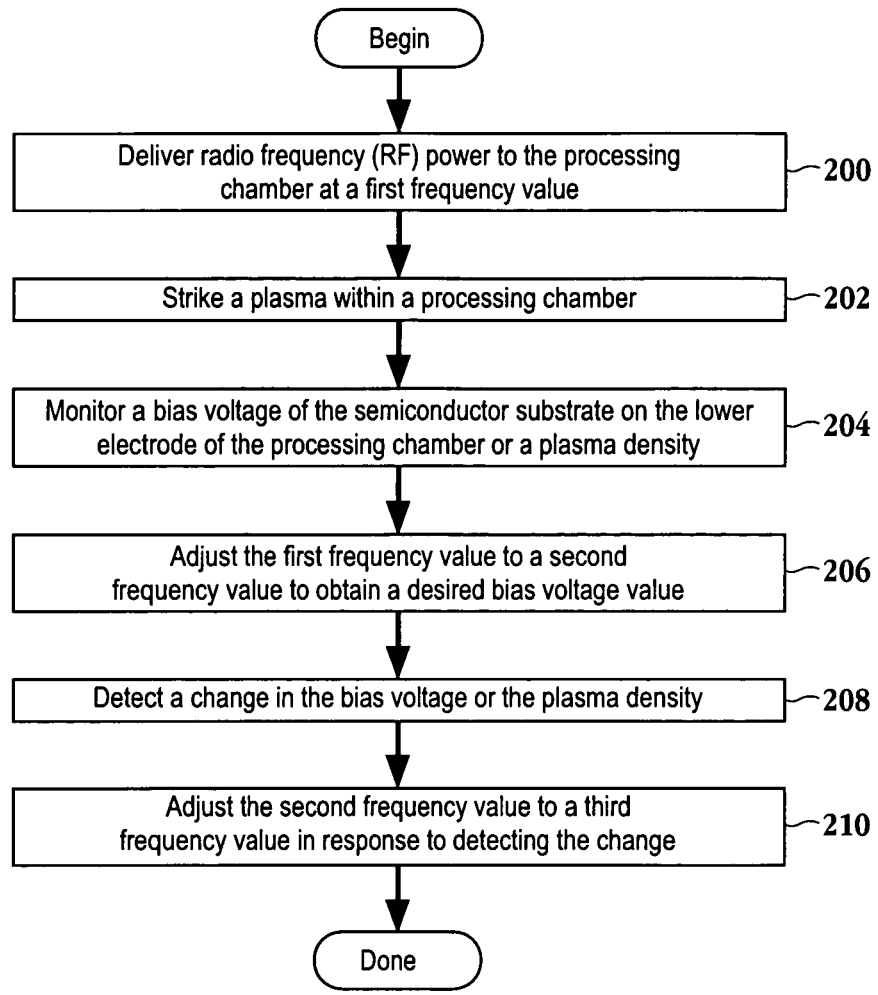
FIG. 5 is a flowchart diagram of the method operations for processing a semiconductor substrate within a plasma chamber in accordance with one embodiment of the invention.

FIG. 5 is a flowchart diagram of the method operations for processing a semiconductor substrate within a plasma chamber in accordance with one embodiment of the invention. The method initiates with operation 200, where RF power is delivered to the processing chamber at a first frequency. For example, the RF power may be initially delivered at a frequency of 60 MHz. The method then advances to operation 202, where a plasma is struck within the processing chamber. Initially, a match network may tune the plasma as described with reference to commonly assigned U.S. Pat. Nos. 5,793,162 and 6,259,334. The method then proceeds to operation 204 where the bias voltage associated with the semiconductor substrate being processed is monitored. A desired bias voltage set point may be targeted and a controller may adjust the frequency of the RF power to achieve the set point bias voltage as specified in operation 206. In one embodiment, the frequency of the RF power is adjusted to be within +/−5% of the nominal operating. For example, where the nominal operating frequency of the RF generator is 60 MHz, the adjustment may be within the range of 60+/−3 MHz. The same percentage range may be applied to the 2 MHz and 27 MHz generators when they are supplying the RF power to the chamber. In one embodiment, the plasma density may be monitored to provide feedback on adjusting the frequency within the range.

Still referring to FIG. 5, where the method moves to operation 208 where a change is detected in the bias voltage being experienced by the semiconductor substrate or the plasma density. It should be appreciated that during processing inductance may change because of variables changing, e.g., temperature, during the processing. Consequently, the bias voltage may change. In response to the change in the bias voltage from the desired set point, the frequency of the RF power changes to bring the bias voltage back to the desired set point in operation 210. As mentioned above, the plasma density may be monitored as an alternate to the bias voltage. For example, the plasma density within an inner region of the processing chamber and/or a plasma density within an outer region of the processing chamber are monitored to provide feedback on frequency adjustments.

In summary the embodiments described above define three tunable elements for controlling the bias voltage, which impacts the inner and outer splits mentioned above, the load, which is accomplished through the variable capacitive element C1 of FIG. 2, and the phase, which controlled by variable capacitive element C2 of FIG. 3A. Of course, the phase may be controlled through the generator and the bias voltage may be controlled through variable capacitive element C2 of FIG. 3B, in an alternative embodiment. In essence, the third tunable element controlling the bias voltage, which interacts with the other two tunable elements, provides for more flexibility to manipulate the inner and outer power distribution so that a uniform etch rate may be maintained. It should be appreciated that while many of the embodiments described herein refer to the generator being a 60 MHz generator, the embodiments are also applicable to 27 MHz, and 2 MHz generators, as well as any other suitable RF generators. It should be appreciated that the configuration for controlling the inner and outer split of the power returns discussed herein may be employed with plasma chambers of the assignee, e.g., the FLEX 45, FLEX, and EXELAN 2300 systems, as well as any other suitable plasma processing system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing system, comprising:
   a radio frequency (RF) power generator configured to have a tunable frequency power output, the frequency output adjustable within a range;
   a processing chamber having a bottom electrode and a top electrode, a plasma region defined between the bottom and top electrodes, the processing chamber receiving RF power from the RF power generator;
   a match network coupled between the RF power generator the processing chamber, the match network having a first tunable element and a second tunable element each tunable element located between the RF power generator and the bottom electrode of the processing chamber, the first tunable element adjusting a split between a first grounding pathway defined within an inner region of the plasma region between the bottom electrode and the top electrode and a second grounding pathway defined within an outer region of the plasma region between the bottom electrode and a grounding shield disposed over a surface of a focus ring, the focus ring located around a periphery of the bottom electrode, the second tunable element adjusting a load delivered to the processing chamber from the power generator.

2. The system of claim 1, further comprising:
   a feedback controller monitoring a bias voltage associated with the bottom electrode, the feedback controller comparing the bias voltage to a desired bias voltage, wherein a difference between the bias voltage and the desired bias voltage triggers the feedback controller to adjust the first tunable element resulting in adjustment of the split between the first grounding pathway and the second grounding pathway.

3. The system of claim 1, further comprising:
a feedback controller monitoring a plasma density within the inner region and within the outer region, the feedback controller comparing the plasma density within each region to corresponding desired plasma densities, wherein a difference between the plasma density and the corresponding desired plasma densities triggers the feedback controller to adjust the first tunable element resulting in adjustment of the split between the first grounding pathway and the second grounding pathway.

4. The system of claim 1, wherein the range is within about 5% of a nominal operating set point of the RF power generator.

5. The system of claim 1, further comprising, additional RF power generators, each of the additional RF power generators configured to have corresponding output frequencies adjusted within the range.

6. The system of claim 5, wherein the additional RF power generators include an RF power generator operating at about a 27 megahertz frequency and an RF power generator operating at about a 2 megahertz frequency.

7. The system of claim 5, wherein each RF power generator operates at a frequency that is within 5% of a corresponding nominal operating frequency.

8. A system for processing a semiconductor wafer, the system comprising:
a radio frequency (RF) power generator having a tunable frequency output, the tunable frequency output defined within a range;
a processing chamber having a bottom electrode and a top electrode, a plasma region defined between the bottom and to electrodes, the processing chamber receiving RF power from the RF power generator; and
a match network coupled between the RF power generator and the processing chamber, the match network including a feedback controller monitoring a bias voltage associated with the bottom electrode, the feedback controller configured to adjust an amount of power radially distributed over a surface of substrate being process within the processing chamber, wherein a tunable element representing a variable capacitance that affects the radial distribution of power in the plasma region is located within the match network the tunable element located between the RF power generator and the bottom electrode of the processing chamber, the tunable element adjusting a split between a grounding pathway defined within an inner region of the plasma region between the bottom electrode and the top electrode and a second grounding pathway defined within an outer region of the plasma region between the bottom electrode and a grounding shield disposed over a surface of a focus ring, the focus ring located around a periphery of the bottom electrode.

9. The system of claim 8, wherein the feedback controller causes the frequency of power output to adjust within the range to affect the amount of power radially distributed.

10. The system of claim 8, wherein the tunable element representing a variable capacitance that affects the radial distribution of power in the plasma region is located within the processing chamber.

11. The system of claim 8, wherein the range is between about 5% less than an operating set point and 5% greater than an operating set point.

12. The system of claim 8, wherein the match network provides tuning for a phase of the power output from the generator.

13. The system of claim 8, wherein the power is radially distributed between an inner region defining a first grounding pathway between the bottom electrode and the top electrode and an outer region defining a second grounding pathway between the bottom electrode and a ground extension, the ground extension composed of a dielectric material.

14. A method of processing a semiconductor substrate within a plasma chamber, comprising method operations of:
delivering radio frequency (RF) power to a bottom electrode of the processing chamber at a first frequency value from a radio frequency (RF) generator;
striking a plasma within a processing chamber;
monitoring a bias voltage of the semiconductor substrate on the bottom electrode of the processing chamber;
adjusting the first frequency value to a second frequency value from the radio frequency (RF) generator to obtain a desired bias voltage value through a tunable element located between the RF power generator and the bottom electrode of the processing chamber, and
changing a ratio of power returned through an upper electrode ground path to power returned through a lower electrode ground path in response to adjusting the first frequency value, the lower electrode ground path defined through a grounding shield disposed over a surface of a focus ring, the focus ring located around a periphery of the bottom electrode.

15. The method of claim 14 further comprising:
detecting a change in the bias voltage; and
adjusting the second frequency value to a third frequency value in response to detecting the change.

16. The method of claim 14, wherein the method operation of adjusting the first frequency value to a second frequency value to obtain a desired bias voltage value occurs within a 5% range of a nominal operating frequency value of an RF source.

17. The method of claim 14, wherein the method operation of
adjusting the first frequency value to a second frequency value to obtain a desired bias voltage value includes,
modifying an etch uniformity distribution between an outer region and an inner region of a surface of the semiconductor substrate.

18. The method of claim 14, further comprising:
monitoring a plasma density at both an inner region of the processing chamber and an outer region of the processing chamber; and
adjusting the first frequency value to the second frequency based on a change in the plasma density at one of the inner region or the outer region.

* * * * *